United States Patent [19]

Hasegawa

[11] Patent Number: 4,879,201
[45] Date of Patent: Nov. 7, 1989

[54] METHOD OF MAKING A LITHOGRAPHIC PLATE COMPRISING MICROCAPSULES

[75] Inventor: Akira Hasegawa, Kawashiri, Japan

[73] Assignee: Fuji Photo Film Co., Ltd., Miniami-ashigara, Japan

[21] Appl. No.: 145,839

[22] Filed: Jan. 20, 1988

[30] Foreign Application Priority Data

Jan. 20, 1987 [JP] Japan .................................. 62-12095

[51] Int. Cl.$^4$ ........................... G03C 1/72; G03C 7/00
[52] U.S. Cl. .................................... 430/138; 430/300; 430/302; 430/281
[58] Field of Search ............... 430/178, 310, 302, 281, 430/270

[56] References Cited

U.S. PATENT DOCUMENTS 3,867,150  2/1975  Ketley ................................. 430/138
4,210,711  7/1980  Kitajima et al. .................... 430/253
4,287,290  9/1981  Mizuno et al. ..................... 430/306
4,369,249  1/1983  Mizuno et al. ..................... 430/537
4,557,997 12/1985  Iwasaki et al. ..................... 430/325
4,629,676 12/1986  Hayakawa et al. ................. 430/203

FOREIGN PATENT DOCUMENTS 203613 12/1986  European Pat. Off. ............ 430/138
220943  5/1987  European Pat. Off. ............ 430/138
224214  6/1987  European Pat. Off. ............ 430/138
237054  9/1987  European Pat. Off. ............ 430/138
1441476 6/1976  United Kingdom .

OTHER PUBLICATIONS

Shunich, et al., Chem. Abstracts, 107(04), 31237Q, "Offset Printing Plate Production", 8/86.

Primary Examiner—Paul R. Michl
Assistant Examiner—Patrick A. Doody
Attorney, Agent, or Firm—Burns, Doane, Swecker & Mathis

[57] ABSTRACT

A presensitized lithographic plate comprises a hydrophilic layer and a light-sensitive layer containing silver halide, a reducing agent, a polymerizable compound and a hydrophilic binder provided in order of a hydrophilic support wherein the silver halide, the reducing agent and the polymerizable compound are contained in lipophilic microcapsules which are dispersed in the light-sensitive layer. Another presensitized lithographic plate comprising a hydrophilic layer and a light-sensitive layer containing a photo polymerizable composition or a photo polymerizable compound provided in order on a hydrophilic support wherein the photo polymerizable composition or the photo polymerizable compound are contained in lipophilic microcapsules which are dispersed in the light-sensitive layer is also disclosed.

12 Claims, 1 Drawing Sheet

METHOD OF MAKING A LITHOGRAPHIC PLATE COMPRISING MICROCAPSULES

BACKGROUND OF THE INVENTION

1. Field of the invention

The present invention relates to a presensitized light-sensitive lithographic plate, and more particularly to a simply processable presensitized lithographic plate (hereinafter referred to as PS plate).

2. Description of prior art

PS plates which have a light-sensitive layer formed by coating the surface of an aluminum support with a composition comprising silver halide and a vinyl compound are described in Japanese Patent Provisional Publications Nos. 57(1982)-211146 and 58(1983)-16231. Processes for preparing a lithographic plate from the PS plate comprise: a step (exposure step) of subjecting the PS plate to pattern exposure; a step (development step) of immersing it in a developing solution, washing it with water and dissolving out the light-sensitive layer in the unexposed parts; and a step of coating the surface of the aluminum support with gum arabic and the like to prevent decrease of hydrophilicity which is likely caused when the surface (where the light-sensitive layer has been removed) of the aluminum support is exposed to air. The PS plate utilizing light sensitivity of silver halide is advantageous because it is highly sensitive. However, as described above, the above-mentioned methods need a wet development process employing a developing solution to remove the light-sensitive layer. Therefore, these methods require complicated steps and sometimes may cause problems with respect to hygiene and environmental pollution according to reagents to be used.

Another process for the preparation of a lithographic plate utilizing wet development is disclosed in Japanese Patent Provisional Publication No. 58(1983)-224752. The disclosed process utilizes a presensitized lithographic plate having a light-sensitive layer containing a polymerizable compound which is enclosed with microcapsules having a hydrophilic wall and comprises the steps of: imagewise exposing the light-sensitive layer of the presensitized lithographic plate to a radiation; breaking the microcapsules within the unexposed area of the light-sensitive layer; and thereafter exposing the whole surface of the light-sensitive layer to a light to cure an unpolymerized polymerizable compound. In thus obtained lithographic plate, the exposed area serves as a non-image portion and the unexposed area serves as an image portion. Therefore, this process requires use of hydrophilic microcapsules for enclosing the polymerizable compound therein. Since the use of hydrophilic microcapsules sometimes is not advantageous in practice, a process for the preparation of a lithographic plate involving a transfer step which is free from the limitation to the use of hydrophilic microcapsules is proposed in Japanese Patent Provisional Publication No. 61(1986)-281242.

Various PS plates which have a light-sensitive layer containing a photo polymerizable compound or the like instead of the silver halide, and a hydrophilic layer (e.g., undercoat layer, intermediate layer) is provided between a hydrophilic support and a light-sensitive layer are described in Japanese Patent Provisional Publications Nos. 49(1974)-102403, 51(1976)-71123, 56(1981)-127493 and 57(1982)-125095, and Japanese Patent Publication No. 51(1976)-15764. The PS plate comprising a hydrophilic layer, although it depends on characteristics of the substance which constitutes a hydrophilic layer, has an advantage in that occurence of scumming can be reduced compared with the PS plate comprising a light-sensitive layer directly arranged on a support.

A PS plate comprising a light-sensitive layer containing silver halide, a reducing agent, a polymerizable compound and a hydrophilic binder on a hydrophilic support wherein the silver halide, the reducing agent and the polymerizable compound are contained in lipophilic microcapsules which are dispersed in the light-sensitive layer has been already disclosed in a copending U.S. Ser. No. 116,352.

SUMMARY OF THE INVENTION

An object of the present invention is to provide a presensitized lithographic plate (PS plate) which can give a lithographic plate (planograph) by a simple system without using any developing solution, that is, without requiring a wet development process.

Another object of the invention is to provide a presensitized lithographic plate which can give an improved lithographic plate in which occurence of scumming on a printed matter is greatly minimized and reduced.

A further object of the invention is to provide a presensitized lithographic plate which is able to give a lithographic plate by a simple process with no transferring step.

A still further object of the invention is to provide an improved process for the preparation of a lithographic plate.

The present invention provides a presensitized lithographic plate comprising a hydrophilic layer and a light-sensitive layer containing silver halide, a reducing agent, a polymerizable compound and a hydrophilic binder provided in order on a hydrophilic support wherein the silver halide, the reducing agent and the polymerizable compound are contained in lipophilic (or hydrophobic) microcapsules which are dispersed in the light-sensitive layer.

The invention further provides a process for the preparation of a lithographic plate comprising the steps of:

exposing imagewise to a radiation (light) a above-mentioned presensitized lithographic plate;

heating the exposed light-sensitive layer for development after the above step, whereby the polymerizable compound within the area where a latent image of the silver halide has been formed is cured by polymerization to form a polymer;

heating the developed layer to a temperature of not higher than a thermal softening point of the resulting polymer but not lower than a thermal softening point of the material of the microcapsules, whereby the polymerizable compound within the area where a latent image of the silver halide has not been formed runs out of the microcapsules and is cured by polymerization; and removing the microcapsules together with the hydrophilic layer from the area where a latent image of the silver halide was formed.

The invention furthermore provides a process for the preparation of a lithographic plate comprising the steps of:

exposing imagewise to a radiation the above-mentioned presensitized lithographic plate;

heating the exposed light-sensitive layer for development after the above step, whereby the polymerizable compound within the area where a latent image of the silver halide has been formed is cured by polymerization to form a polymer;

pressing the developed layer to break the microcapsules whereby the polymerizable compound within the area where a latent image of the silver halide has not been formed runs out of the broken microcapsules;

exposing the developed layer, whereby the run-out polymerizable compound is cured by polymerization; and removing the microcapsules together with the hydrophilic layer from the area where a latent image of the silver halide was formed.

The invention also provides a presensitized lithographic plate comprising a hydrophilic layer and a light-sensitive layer containing a photo polymerizable composition or a photo polymerizable compound and a hydrophilic binder provided in this order on a hydrophilic support wherein the photo polymerizable composition or the photo polymerizable compound are contained in lipophilic (or hydrophobic) microcapsules which are dispersed in the light-sensitive layer.

The invention further provides a process for the preparation of a lithographic plate comprising the steps of:

exposing imagewise to a radiation (light) the above-mentioned presensitized lithographic plate;

heating the developed layer to a temperature of not higher than a thermal softening point of the resulting polymer but not lower than a thermal softening point of the material of the microcapsules, whereby the photo polymerizable composition or the photo polymerizable compound within the unexposed area runs out of the microcapsules and is cured by polymerization; and removing the microcapsules together with the hydrophilic layer from the exposed area.

The invention furthermore provides a process for the preparation of a lithographic plate comprising the steps of:

exposing imagewise to a radiation the above-mentioned presensitized lithographic plate;

pressing the developed layer to break the microcapsules whereby the photo polymerizable composition or the polymerizable compound within the unexposed area runs out of the broken microcapsules;

exposing the developed layer, whereby the run-out photo polymerizable composition or the photo polymerizable compound is cured by polymerization; and removing the microcapsules together with the hydrophilic layer from the exposed area.

In the PS plate of the invention, core materials such as photo polymerizable compound or the like are contained in microcapsules which are dispersed in the light-sensitive layer provided on the hydrophilic support. After the exposure and the thermal development (primary heating) (or only exposure in the case that the photo polymerizable composition or the photo polymerizable composition is used), heating (secondary heating) and/or pressure is applied thereto, whereby the light-sensitive layer can be divided into two parts consisting of a part where microcapsules are cured and then removed by wash off and a part where uncured microcapsules are softened or ruptured and as a result, the core materials run outside of the capsules. Thus, an image area (ink-receptive part) and a non-image area (hydrophilic part) can be easily formed in the light-sensitive layer.

In more detail, after the heating treatment (secondary heating), the part where the uncured microcapsules (microcapsules in the image area) are present can form, in conjunction with the hydrophilic layer, a lipophilic film (image area, which comprises material of the microcapsule walls and the core materials) adhering firmly to the hydrophilic support through fuse to a hydrophilic layer, melting-down or rupture of microcapsules. On the other hand, the part where the cured microcapsules (microcapsules in the non-image area, which comprises solid microcapsules dispersed on or in the hydrophilic binder) are present, that is, the part where the core material is polymerized by the exposure is still surrounded by the hydrophilic binder and provided on the hydrophilic layer so that this part can be easily removed from the support together with the hydrophilic layer, for instance, by wash-off using water and can form a hydrophilic part (non-image area) area the support. Alternatively, the solid microcapsules dispersed on or in the hydrophilic binder can be removed by applying a dampening water thereto at an initial stage of a following printing process.

As an embodiment of the PS plate of the invention, in the above described image formation process (process in which the light-sensitive layer is separated into the image area and the non-image area), the PS plate comprising a light-sensitive layer containing silver halide, a reducing agent and a polymerizable compound which are contained in microcapsules can employ an image forming method that the polymerization of the polymerizable compound in the area where a latent image of the silver halide has been formed (or has not been formed) by exposing and/or heating (primary heating) is selectively accerelated as described in Japanese Patent Provisional Publication No. 61(1986)-69062 (corresponding to U.S. Pat. No. 4,629,676), and hence the lithographic plate having a high sensitivity can be easily prepared.

Accordingly, the PS plate of the present invention can easily give a lithographic plate by developing it by heating after exposure and applying heating and/or pressure thereto without need of using any developing solution.

When the lithographic plate is prepared employing the PS plate of the invention, the microcapsules can completely be removed without remaining on non-image part, because the hydrophilic layer of non-image part can be removed by the wash-off. Accordingly, the lithographic plate employing the PS plate can prevent ink from adhering onto non-image part where the microcapsule remains. Therefore, the PS plate of the invention can give a printed matter reduced in occurence of the scumming.

DETAILED DESCRIPTION OF THE INVENTION

Figure 1:
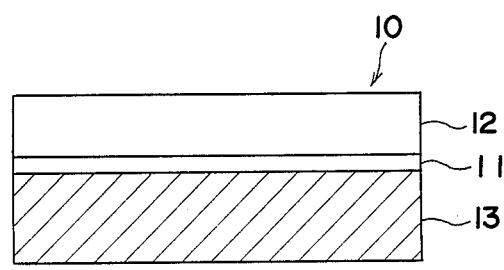
FIG. 1 schematically shows a structure of a presensitized lithographic plate.

As is illustrated in FIG. 1, a presensitized lithographic plate (PS plate) 10 of the present invention comprises a hydrophilic layer 11 and a light-sensitive layer 12 which are provided in order on a hydrophilic support 13.

In an embodiment, the light-sensitive layer contains at least silver halide, a reducing agent, a polymerizable compound all of which are contained in microcapsules and a hydrophilic binder. In another embodiment, the light-sensitive layer contains at least a photo polymerizable composition and/or a photo polymerizable compound which is contained in microcapsules and a hydrophilic binder.

The PS plates of the invention are described hereinbelow by referring to the case where a hydrophilic layer and a light-sensitive layer containing silver halide, a reducing agent, a polymerizable compound which are contained in microcapsules and a hydrophilic binder are provided on a hydrophilic support.

There is no specific limitation with respect to silver halide contained in the light-sensitive layer of the PS plate. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publications Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 10 $\mu$m, more preferably 0.001 to 5 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the PS plate has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The PS plates employing the reducing agent which has these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also stated in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the PS plate of the present invention. Thus, "reducing agent(s)" in the present specification means to include all of the reducing agents described in the above-mentioned publications and applications.

These reducing agents can be used singly or in combination. In the case that two or more reducing agents are used in combination, it is preferred to use a hydroquinone-type reducing agent as one reducing agent. In such case, certain interactions between these reducing agents can be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl} phenyl]hydrazine, 1-{4-(2,5-di-tert-pentylphenoxy)-butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)butylamide} phenyl]hydrazine, 1-acetyl-2-[4-{2-(2,4-tert-pentylphenozy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine. 1-(4-butoxybenzoyl)-2-trityl-hydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized, the polymerizable compounds having a relatively higher boiling point (e.g., 80° C. or higher) that are hardly evaporated upon heating are preferably employed.

The polymerizable compound employable for the PS plate are described in the above-mentioned and later-mentioned publications concerning the light-sensitive material.

Preferred polymerizable compounds employable for the PS plate are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. The compounds having an ethylenic unsaturated group are preferred.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more pollymerizable compounds can be employed, Further, compounds formed by bonding a polymerizable group such as a vinyl group or a vinylidene group to a reducing agent or a color image forming substance are also employed as the polymerizable compounds. The PS plates employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The silver halide and polymerizable compound are contained in the lipophilic microcapsules (microcapsules having a lipophilic wall or shell) which are dispersed in the light-sensitive layer. There is no specific limitation on the process for the preparation of the microcapsules, and various known manners can be employed.

Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967) -446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using ureaformaldehyde or urea-formaldehyde-resorcinol wall-forming materials as described in U.S. Pat. Nos. 4,001,140, 4,087,376 and 4,089,802; a process of using melamine-formaldehyde resins, hydroxypropyl cellulose or like as a wall-forming material as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; and a spray-drying process as described in U.S. Pat. No. 3,111,407 and U.K. Pat. No. 930,422. It is preferable, though not limitative, that the microcapsule is prepared by emulsifying core materials containing the polymerizable compound and forming a polymeric membrane (i.e., shell or wall) over the core materials.

There is no specific limitation on the lipophilic shell (wall) material of the microcapsule, and various known materials can be used. However, it is preferred that the shell material which is used in the invention is lipophilic and has a contact angle of not less than 40°. Examples of the shell material include polyurea, polyurethane, polyethylene, polyamide, polyester, polycarbonate, polyethyleneamine, phenol-formaline resin, melamine resin, vinyl polymer and vinyl copolymer, polyacrylonitrile, polyvinyl acetal resin, cellulose acetate, polypropylene, polybutadiene and their mixtures.

It is desired that the shell material of the microcapsule is a material which is thermally softened by heating at a relatively low temperature (secondary heating), that is, a material having a relatively low glass transition temperature. If the glass transition temperature is low, the shell material can be softened at low temperatures and the polymerizable compound (monomer) is leached out from the microcapsules (containing the core materials) present in the uncured part to thereby form a uniform film which is lipophilic and an image area. The glass transition temperature preferably is in the range of from 80° C. to 300° C., more preferably 80° C. to 220° C. The glass transition temperature is a value measured at a heating rate of 2° C./min. by using RHEOVIBRON DDV-II type (produced by Toyo Baldwin Co., Ltd.). When the glass transition temperature is lower than the range defined above, the stability of the microcapsule becomes poorer with lapse of time, while when the glass transition temperature is higher than the range defined above, a high heating temperature must be set and hence the support itself is adversely affected thereby.

From the viewpoints of the above-described facts, preferred are polyurea, polyurethane, polyester, polycarbonate, polyamide and mixtures thereof as the shell material of the microcapsule. Polyurea and polyurethane are particularly preferred.

The particle size of the microcapsule formed by the shell material is in the range of preferaly from 0.01 to 30 μm. The particle size preferably should be in the range of from 0.01 to 10 μm from the viewpoint of handling and preferably in the range of from 0.01 to 5 μm from the viewpoint of resolving power.

A hydrophilic binder is also contained in light-sensitive layer together with the microcapsule.

It is desirable that the hydrophilic binder used in the PS plate of the present invention is transparent or translucent. Examples of such hydrophilic binder include natural materials such as gelatin, gelatin derivatives, cellulose derivatives (e.g., carboxymethylcellulose, methylcellulose, etc.) and polysaccharides (e.g., starch, gum arabic, etc.); and synthetic polymers such as water-soluble polyvinyl compounds such as polyvinyl alcohol, polyvinylpyrrolidone, acrylamide polymer, polyacrylic acid and vinyl acetate-acrylic acid copolymer. These compounds may be used either alone or as a mixture of two or more of them.

The hydrophilic binder is used preferably in an amount of 0.5 to 20 weight %, more preferably 1 to 10 weight %, based on the amount of the microcapsules including their contents. It is generally preferred to use the hydrophilic binder in a small amount, for facilitating the removal of the solid microcapsules containing the cured compound by washing with water.

The hydrophilic layer of the present invention is described in below.

The hydrophilic layer comprises of hydrophilic polymer. There is no specific limitation with respect to the hydrophilic polymer employed in the invention. Examples of the hydrophilic polymers include natural materials such as gum arabic, cellulose derivatives (e.g., methylcellulose, ethycellulose, hydroxyehtylcellulose, carboxymethylcellulose, etc.); starch derivatives (e.g., roaster starch, denatured starch, alkyleneoxide denatured starch, α-starch, dextrin, dialdehyde starch) and natural or semi-synthetic polymer (e.g., salt of alginic acid, locust bean gum, stractan, stellabic, pullulan).

The synthetic polymers such as polyvinyl alcohol, polyvinyl pyrrolidone, polyacrylamide, polyvinyl methyl ether, polyethylene oxide, copolymer of vinyl methyl ether and maleic unhydride, polyvinylphosphonic acid, polyvinylmethyl phosphinic acid can also be used. These polymers may be used either alone or as a mixture of two or more of them.

The hydrophilic layer is usually prepared by dissolving the hydrophilic polymers in an aqueous medium (an aqueous solution containing an organic solvent may be used) to obtain a coating solution, coating the obtained coating solution on a hydrophilic support (described hereinafter), and drying the coated solution. The coating amount of the hydrophilic layer preferably ranges from 1 to 500 mg/m$^2$, and more preferably ranges from 1 to 200 mg/m$^2$.

A filler (e.g., clay, alumina, silica and the like) can be added to the hydrophilic layer as an additive agents (water-holding agents) in order to improve characteristics of printing. The filler can be employed after adjusting a specific particle diameter as described in Japanese Patent Provisional Publication No. 51(1976)-15764. A surface active agent can also be employed as described in Japanese Patent Publication No. 55(1980)-82695. Examples of the surface active agents include nonionic surface active agents such as a polyoxyethylene alkyl ether, a polyoxyethylene alkyl phenyl ether, a polyoxyethylene ester of fatty acid, a sorbitan ester of fatty acid, a polyoxyethylene sorbitan ester of fatty acid; anion surface active agents such as a salt of fatty acid, a salt of alkyl sulfate, a salt of alkylbenzene sulfonate, a salt of alkylnaphthalene sulfonate, a salt of dialkyl sulfosuccinate, a salt of alkyl phosphate, a condensation of formalin of naphthalenesulfonate, a salt of polyoxyethylene alkyl sulfates; cationic surface active agents such as salts of alkylamines, salts of quaternary ammonium, salts of polyoxyethylene alkylamine; fluoric surface active agents. These surface active agents can be used singly or in combination. A water soluble metallic salt (e.g., zinc acetate) can be contained in the hydrophilic layer as described in U.S. Pat. No. 3,860,426.

Any of known hydrophilic support materials can be used as the hydrophilic support of the present invention. Examples of such support materials include paper, synthetic paper, plastic-laminated paper (e.g., polyethylene, polypropylene or polystyrene laminated paper), metallic sheets (e.g., zinc, iron or copper sheet), plastic film such as a film of cellulose acetate, cellulose propionate, cellulose butyrate, polyethylene terephthalate, polyethylene, polystyrene, polypropylene, polycarbonate or polyvinyl acetal, and the metal laminated or deposited paper or plastic film. Paper, synthetic paper, polyethylene-terephthalate film, polycarbonate film and aluminum sheet are preferred. The paper support is described in more detail in Japanese Patent Provisional Publication Nos. 61(1986)-3797 and 61(1986)-112150.

If necessary, the surface of the support may be processed. For instance, the support may be subjected to a surface-roughing treatment (graining treatment) or a treatment for making the surface hydrophilic.

The present invention will be described below by referring to the case where an aluminum sheet is used as the support.

Examples of methods for surface treatment (graining treatment) include an electrochemical graining method wherein an aluminum sheet is grained in a hydrochloric acid or nitric acid electrolytic solution by applying an electric current thereto; and mechanical graining methods such as a wire brush grain method wherein the surface of an aluminum sheet is scratched with a metal wire, a ball grain method wherein the surface of an aluminum sheet is grained with an abrasive and an abrasive ball and a brush grain method wherein the surface of an aluminum sheet is grained with a nylon brush and an abrasive. Such methods can be used singly or in combination.

The grained aluminum sheet is then etched chemically with an acid or an alkali. An industrially advantageous method is etching with an alkali.

Preferred examples of the alkaline agents include sodium carbonate, sodium aluminate, sodium metasilicate, sodium phosphate, sodium hydroxide, potassium hydroxide and lithium hydroxide. The concentration of the alkaline agent in an alkaline solution is in the range of preferably from 1 to 50 weight %. The alkaline solution is preferably used at a temperature of 20° C. to 100° C. There are preferred such conditions under which the amount of the aluminum sheet to be dissolved is 5 to 20 g/m$^2$.

Generally, after the alkali etching is complete, pickling is carried out to remove smuts which are left behind on the surface of the aluminum sheet. Preferred examples of acid used in the pickling include nitric acid, sulfuric acid, phosphoric acid, chromic acid, hydrofluoric acid, borofluoric acid, etc.

Removal of smut after the electrochemical surface-roughing treatment can be effected by a method wherein the aluminum sheet is brought into contact with a 15 to 65 weight % sulfuric acid solution at a temperature of from 50° C. to 90° C., as described in Japanese Patent Provisional Publication No. 53(1978)-12739 or a method described in Japanese Patent Publication No. 48(1973)-28123.

In the above-described way, an aluminum support whose surface has been roughened can be obtained. If desired, the aluminum support can be further subjected to an anodic oxidation treatment or a chemical treatment.

The anodic oxidation treatment may be carried out by any of conventional methods. For instance, the anodic oxidation treatment can be made by a method wherein direct current or an alternating current is applied to aluminum in sulfuric acid, phosphoric acid, chromic acid, oxalic acid, sulfamic acid or benzenesulfonic acid, a solution composed of a combination of two or more of these acids, an aqueous solution of one of said acids or an aqueous solution containing a combination of two or more of these acids to form an oxide film on anode on the surface of the aluminum support.

Process conditions for the anodic oxidation varies depending on the type of the electrolytic solution to be used, but are generally such that the concentration of the electrolytic solution is from 1 to 80 weight %, the temperature of the electrolytic solution is from 5° C. to 70° C., current density is from 0.5 to 60 A/dm$^2$, voltage is 1 to 100 V and the period of time for the electrolytic process is from 10 to 100 seconds.

As said anodic oxidation method, there are particularly preferred a method wherein anodic oxidation is carried out in sulfuric acid at a high current density, as described in British Pat. No. 1,412,768 and a method wherein anodic oxidation is carried out by using an electrolytic bath as phosphoric acid, as described in U.S. Pat. No. 3,511,661.

The anodic oxidation-treated aluminum sheet may be further subjected to an alkali metal silicate treatment (for instance, a treatment wherein the sheet is immersed in an aqueous solution of sodium silicate) as described in U.S. Pat. Nos. 2,714,066 and 3,181,461. If desired, an undercoat layer composed of a hydrophilic cellulose (e.g., carboxymethylcellulose) containing a water-soluble salt (e.g., zinc acetate) may be provided on the treated aluminum sheet as described in U.S. Pat. No. 3,806,426.

The PS plate described above comprises a light-sensitive layer containing silver halide, the reducing agent and the polymerizable compound contained in the microcapsule and the hydrophilic binder. Otherwise, the PS plate of the present invention may comprise a light-sensitive layer containing photo-polymerizable composition or a photo polymerizable compound.

A mixture of photo polymerization initiators and photo polymerizable compound can be used as the photo polymerizable composition. The polymerizable compound employable for the photo polymerizable composition is same as the above stated polymerizable compound.

Examples of the photo polymerization initiators include α-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, α-halo-α-phenylacetophenones, redox couples of photo reducible dye and reducing agent, paraffin halide (e.g., brominated paraffin, chlorinated paraffin), benzoyl alkyl ethers, lophine dimer-mercapto compound couples. Aromatic ketones are preferred.

Concrete examples of the photo polymerization initiators include 2,2-dimethoxy-2-phenylacetophenone, 9,10-anthraquinone, benzophenone, Michler's ketone, 4,4-diethylaminobenzophenone, xanthone, chloroxanthone, thioxanthone, chlorothioxanthone, 2,4-diethylthioxanthone, chlorosulfonylxanthone, chlorosulfonylanthraquinone, chloromethylanthracene, chloromethylbenzothiazole, chlorosulfonylbenzoxazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis(o-chloro-phenyl)-4,4',5,5'-tetraphenylbiimidazole and 2-merecapto-5-methylthio-1,3,4-thiadiazole.

The photo polymerization initiator can be employed singly or in combination of two or more compounds.

The photo polymerization initiator is preferably used in amount ranging form 0.5 to 30 weight %, more preferably 2 to 20 weight %, based on the amount of the polymerizable compound.

Instead of the photo polymerizable composition, a photo polymerizable compound having a photo polymerization property can be used.

Examples of the photo polymerizable compounds include ester silicate such as acrylamide, barium acrylate, glycerol triacrylate, N,N'-methylenebisacrylamide, polyethylene glycol diacrylate, pentaerythritol diacrylate, pentaerythritol triacrylate, vinylcarbazole and polyvinyl alcohol. A compound conducting the light-sensitive group to the polymerizable compound can be used as a photo polymerizable compound.

The PS plate of the present invention can take any form of the two embodiments. Optional components may be contained in the light-sensitive layer constitute. Auxiliary layers may be optionally arranged on the PS plates.

The optional components which may be contained in the light-sensitive layer, and auxiliary layers which may be optionally arranged on the PS plates are described below by referring to the case where the light-sensitive layer comprising silver halide, a reducing agent and a polymerizable compound which are contained in microcapsules.

In the PS plate, the silver halide, the reducing agent and the polymerizable compound are contained in microcapsules. Optional components which may be contained in the light-sensitive layer can also be contained in the microcapsules. In the case that the silver halide is contained in the microcapsules, the silver halide is preferably arranged in the shell material of the microcapsules.

The light-sensitive layer can further contain such optional components as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, fluorescent brightening agents, photo polymerization initiators and solvents of the polymerizable compound.

There is no specific limitation with respect to other color image forming substance, and various kinds of substances can be employed. Where the color image forming substance is contained in the light-sensitive layer, it is easy to distinguish the image area from the non-image area because the image area or the non-image area can be colored. Examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Published Specification No. 0174634A2), and the color image forming substance can be employed for the PS plate of the invention.

There is no specific limitation with respect to the sensitizing dyes, and known sensitizing dyes used in the conventional art of photography may be employed in the PS plates. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol. per 1 mol. of silver halide. The sensitizing dye is preferably added in the stage of the preparation of the silver halide emulsion (simultaneously with or after the grain formation).

If the heat development is to be employed in the use of the PS plate, an organic silver salt is preferably contained in the PS plate. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming the organic silver salt include aliphatic or aromatic carboxylic acids, thiocarbonyl group-containing compounds having a mercapto group or an α-hydrogen atom, imino group-containing compounds, and the like. Benzotriazoles are most preferable. The organic silver salt is preferably used in an amount of from 0.01 to 10 mol., and more preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the PS plates. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100 weight %, and more preferably from 0.1 to 40 weight %, based on the total solid content of the light-sensitive layer. These bases or base precursors can be used singly or in combination.

In the PS plate, the silver halide, the reducing agent and the polymerizable compound are preferably contained in a microcapsule and the base or base precursor is prefarably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a clear image part and a clear non-image part. Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (Dec. 1976).

The antioxidants can be used to eliminate the influence of the oxygen which has an effect of inhibiting polymerization in the development process. An example of the antioxidant is a compound having two or more mercapto groups.

The thermal polymerization initiators employable in the PS plate preferably are compounds that are decomposable under heating to generate a polymerization initiating species, particularly a radical, and those commonly used as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, ditert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120 weight %, and more preferably from 1 to 10 weight %, based on amount of the polymerizable compound. In a system in which the polymerizable compound within the area where the latent image has not been formed is polymerized, the thermal polymerization initiators are preferably incorporated into the light-sensitive layer. The light-sensitive material using the thermal polymerization initiators is described in Japanese Patent Provisional Publication No. 61(1986)-260241, and the thermal polymerization initiator can be employed for the PS plate of the invention.

The development stopping agents employable in the PS plate are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement stated in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the PS plate preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former stated in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of said particle is preferably larger than that of the microcapsule.

Examples and usage of the other optional components which can be contained in the light-sensitive layer are also described in the above-mentioned publications and applications concerning the light-sensitive material, and in Research Disclosure Vol. 170, No. 17029, pp. 9–15 (June 1978).

Examples of auxiliary layers which are optionally arranged on the PS plate include an image-receiving layer, a heating layer, an antistatic layer, an anticurl layer, a release layer, a cover sheet or a protective layer, a layer containing a base or base precursor, and a base barrier layer.

Some of the optional components and the auxiliary layers can also be used in the second embodiment that the light-sensitive layer comprises a photo polymerizable composition or a photo polymerizable compound.

The PS plate can be prepared, for instance, by the following process.

The PS plate is usually prepared by coating a coating solution for preparation of hydrophilic layer and then an independently prepared coating solution for preparation of light-sensitive layer on the support, and drying the coated layers. The coating solution for preparation of light-sensitive layer comprises of a process of dissolving, emulsifying or dispersing each of the components of the light-sensitive layer in an adequate medium to obtain a liquid composition and a process of microcapsuling the liquid composition to obtain a coating solution containing a dispersed microcapsules.

The coating solution containing the dispersed microcapsules can be prepared by encapsulating the mixed liquid compositions containing a component of the light-sensitive layer. A liquid composition containing two or more components can be used in the preparation of the coating solution. Some components of the light-sensitive layer can be directly added to the coating solution or the liquid composition. Further, a secondary composition can be prepared by emulsifying an oily (or an aqueous) composition in an aqueous (or an oily) medium to obtain the coating solution.

The method for preparation of the liquid composition and the coating solution will be described below by referring to the case where the light-sensitive layer contains silver halide (the first embodiment). In the case that the light-sensitive layer contains the photo polymerizable composition or the photo polymerizable compound (the second embodiment), the liquid composition and the coating solution can be prepared in the same manner.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. IN order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

In the preparation of the silver halide emulsions, hydrophilic colloids are advantageously used as protective colloids. Examples of the hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, partially acetallized polyvinyl alcohol, poly-N-vinylpyrrolidone, polyacrylic acid, polymethacrylic acid, polyacrylamide, polyvinylimidazole, and polyvinylpyrazole, and copolymers comprising monomers constituting these homopolymers. Gelatin is most preferred. Examples of employable gelatins include not only lime-processed gelatin, but also acid-processed gelatin and enzyme-processed gelatin. Hydrolysis products or enzymatic decomposition products of gelatin can also be used.

When hydrophilic colloids are used for the preparation of a silver halide emulsion, the sensitivity of the PS plate can be improved. In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose or overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials, and these methods can be employed for the PS plate of the invention.

When the sensitizing dyes are added to the silver halide emulsion, the sensitizing dye is preferably added in the course of the preparation of the emulsion. When the organic silver salts are introduced into the light-sensitive microcapsule, the emulsion of the organic silver salts can be prepared in the same manner as in the preparation of the silver halide emulsion.

The polymerizable compounds are used as the medium for preparation of the liquid composition containing another component of the light-sensitive layer. For example, the silver halide (including the silver halide emulsion) or the reducing agent can be dissolved, emulsified or dispersed in the polymerizable compound to prepare the PS plate. Especially, the color image forming substance is preferably incorporated into the polymerizable compound. Further, the necessary components for the preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Further, optional components, such as the reducing agents, the color image forming substances may dissolved, emulsified or dispersed in the light-sensitive composition. Furthermore, the necessary components for preparation of the microcapsule, such as shell wall-forming materials can be incorporated into the light-sensitive composition.

The light-sensitive composition are preferably emulsified in an aqueous medium to prepare the microcapsule in the invention. The necessary components for preparation of the microcapsule, such as shell materials can be incorporated into the emulsion. Further, other components such as a reducing agent can be added to the emulsion.

The emulsion of the light-sensitive composition is then processed for forming shell of the microcapsule.

In the above-mentioned process, an aqueous dispersion of the microcapsules can be obtained. The PS plate of the invention can be prepared by coating and drying the dispersion of the microcapsules on a hydrophilic layer which are prepared by coating and drying the coating solution for preparation of light-sensitive layer on hydrophilic support. The coating solution is coated on the support in a conventional manner.

Use of the PS plate is described below.

In the use of the PS plate of the invention, simultaneously with or after imagewise exposure (a development process is treated in the first embodiment), a treatment carried out to form a lipophilic film within the area where the polymerizable compound is not polymerized.

Various exposure means can be employed in the imagewise exposure, and in general, the latent image of the silver halide is obtained by imagewise exposure to radiation including visible light. The type of light source and exposure can be selected depending upon the light-sensitive wavelengths determined by spectral sensitization or sensitivity of silver halide. Examples of the light sources include mercury vapor lamp, metal halide lamp, xenon lamp, chemical lamp, carbon arc lamp, tungsten lamp and infrared lamp. Scanning exposure with laser beams can be used in the invention. Examples of the laser beams include semiconductor laser, helium-neon laser, argon laser, krypton laser and helium-cadmium laser beams.

As the development process for the first embodiment of the PS plate of the invention, a heat (thermal) development process is preferred, because the process can be simply operated and the development can be conducted within a short time. Such a heat development process is described in more detail in Japanese Patent Provisional Publication No. 61(1986)-69062.

Heating (primary heating) in the heat development process can be conducted in various known manners. The heating layer which is arranged on the PS plate can be used as the heating means in the same manner as the light-sensitive material described in Japanese Patent Provisional Publication No. 61(1986)-294434, or a process wherein the heat development is carried out while controlling the amount of oxygen present in the light-sensitive material as in the image forming method disclosed in Japanese Patent Provisional Publication No. 62(1987)-210461. Heating temperatures for the development process generally ranges from 80° C. to 200° C., and preferably from 100° C. to 160° C. The heating time is generally from 1 second to 5 minutes, and preferably from 5 seconds to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If the nature or amount of the reducing agent is controlled, the polymerizable compound within the area where the latent image has not been formed can be polymerized in the same manner as the light-sensitive material described in Japanese Patent Provisional Publication No. 61(1986)-260241.

The PS plate of the invention can be advantageously used in the production of a lithographic plate. There are various methods including the exposure and heat development (heat development process, primary heating) for the production of the lithographic plate.

Examples of the methods includes: (1) pattern exposure→heat development→secondary heating→washoff→gumming up; (2) pattern exposure→heat development→heat development→secondary heating→whole exposure→wash-off→gumming up; (3) pattern exposure→heat development→pressurizing→whole exposure→wash-off→gumming up; (4) heat printing→wash-off→gumming up; (5) heat printing→whole exposure→wash-off→gumming up; and (6) pressure printing→whole exposure→wash-off→gumming up.

The method for preparing a lithographic plate will be described in more detail below by referring to the above method (2) (the method employing the PS plate in the first embodiment). However, other methods can be carried out in a similar manner to that described below.

When the PS plate of the present invention is heat-developed (primary heating) after pattern exposure, a polymerization reaction proceeds in the microcapsules (containing core materials) ian the exposed part (forming a non-image area), the polymerizable compound is polymerized and the heat softening temperature is raised. In other words, the heat softening temperature of the cured part becomes higher than that of the microcapsules in the unpolymerized (uncured) part. Accordingly, even when the polymerized (cured) microcapsules are heated at a higher temperature (secondary heating: heating at a temperature of not higher than the heat softening temperature of the cure part, but not lower than the heat softening temperature of the uncured part), the microcapsules do not cause softening, fusing, melting and breakage or the core materials are not released and hence the microcapsules are still surrounded by the hydrophilic binder. On the other hand, the microcapsules in an unexposed part remain still uncured. The microcapsules in the part (which forms an image area) are stable during normal handling or under normal conditions. However, when the microcapsules are heated at a temperature of higher than the heat development temperature (secondary heating; heating at a temperature of not higher than the heat softening temperature of the microcapsules in the cured part, but not lower than the heat softening temperature of the microcapsules in the uncured part), the microcapsules in the uncured part are softened, fused together, melted and broken so that the shells and/or the core materials of the microcapsules are mixed with one another to form a hydrophobic uniform film, thus forming the image area (ink-receptive part).

The above-mentioned secondary heating is generally performed by heating the plate to a temperature of 80 to 300° C., preferably 80° to 250° C., more preferably 80° to 220° C., for a period of 3 seconds to 20 minutes, preferably 4 seconds to 15 minutes, more preferably 6 seconds to 10 minutes.

Then, the part of the cured microcapsules can be easily removed together with the hydrophilic layer from the support by wash-off, thus forming the non-image area (hydrophilic part). The resulting hydrophobic uniform film (image area) is subjected to whole exposure to impart much improved resistance to plate wear (higher strength). Generally, gumming is conducted with gum arabic to prevent lowering in the hydrophilicity of the support part forming the non-image area. In the way, a lithographic plate having the image area and the non-image area can be prepared.

In the above manufacturing method the secondary heating can be included in the first heat development. Heating may be continuously carried out at an appropriate temperature (which may be a given temperature, or may be changed stepwise or with a temperature gradient). Instead of conducting the secondary heating, pressure may be applied to the microcapsules to rupture them and the hydrophilic uniform film can be formed in a similar manner to that described above.

The step for pressing the exposed light-sensitive layer can be carried out at a pressure of 100 to 600 kg/cm$^2$, more preferably 150 to 500 kg/cm$^2$.

The pressing procedure and the secondary heating in combination can be carried out simultaneously or in sequence. If desired, the microcapsules in the non-image area may be removed directly on a printer without carrying out wash-off and gumming up. This is a preferred method, because it is very simple and printing can be immediately conducted.

In the above embodiment, there has been described a method for preparing a lithographic plate wherein the polymerizable compound within the area where a latent image of silver halide has been formed is polymerized However, a lithographic plate can also be prepared by a method wherein the polymerizable compound within the area where a latent image of silver halide has not been formed is polymerized as described above.

The PS plate of the invention can be advantageously used in offset printing.

The present invention is further described by the following examples without limiting the invention.

EXAMPLE 1

Preparation of silver halide emulsion

In 3,000 ml of water were dissolved 40 g of gelatin and 23.8 g of pottasium bromide, and the resulting gelatin solution was kept at 50° C. To the gelatin solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0 to obtain a silver iodobromide emulsion having tetradecahedral grains, uniform grain size distribution and a mean size of 0.2 μm. The yield of the emulsion was 400 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate was dissolved 0.40 g of the following copolymer.

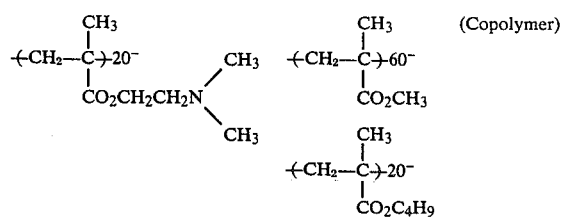

(Copolymer)

To 10.8 g of the resulting solution were added a solution in which 0.22 g of Emulex NP-8 (tradename of Nippon Emulsion Co., Ltd.) and 0.65 g of the following reducing agent (I) and 0.73 g of the following reducing agent (II) are dissolved in 2.4 g of methylene chloride.

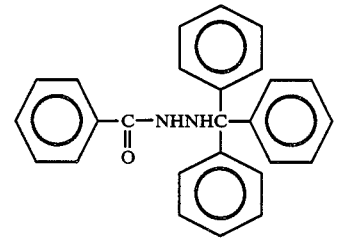

(Reducing agent (I))

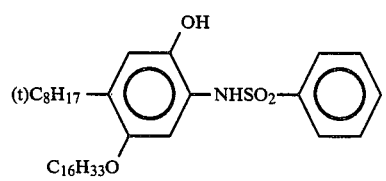

(Reducing agent (II))

To the mixture were further added 2.4 g of the silver halide emulsion and 0.066 g of the silver benzotriazole emulsion, and the mixture was stirred at 15,000 r.p.m. for 5 minutes to obtain a light-sensitive composition.

Preparation of light-sensitive microcapsule

To the light-sensitive composition was dissolved 4 g of an adduct of xylene diisocyanate and trimethylolpropane (tradename "Takenate D110N" produced by Takeda Chemical Industries, Ltd.). The resulting solution was added to 25 g of 2 % aqueous solution of polyvinyl alcohol (tradename "PVA-205" produced by Kuraray Co., Ltd.), and the mixture was stirred at 18,000 r.p.m. for 5 min. using homogenizer to obtain an emulsion. The emulsion was subjected to reaction for 2 hours while stirring at 1,000 r.p.m. to obtain a dispersion containing light-sensitive microcapsule which have a shell material made of a polyurea resin.

Preparation of coating solution for hydrophilic layer

To 10 g of water was added 0.1 g of phosphoric acid denaturated starch (phosphatized degree is 0.3, viscosity of 20% aqueous solution is 450 cps at 25° C., produced by Nichiden Kagaku Co., Ltd.) to obtain 1% aqueous solution of a coating solution for formation of hydrophilic layer.

Preparation of support

A surface of an aluminum sheet having a thickness of 0.24 mm was grained using a nylon blush and an aqueous suspension containing a pumice powder on 400 mesh, and theb the sheet was washed with water. The aluminum sheet was immersed in 10% aqueous sodium hydroxide solution at 50° C. for 60 seconds for etching. Thereafter, the sheet was washed with running water, neutralized, and then washed using 20% aqueous nitric acid. Subsequently, in 1% aqueous nitric acid, the electrochemical surface-roughing treatment was effected in the anoidically electric amount of 160 coulomb/dm$^2$ under such conditions as anoidically voltage of 12.7 V and the cathode electric amount ratio to the anoidically electric amount of 0.8 using sine wave alternating-corrugated current. The center line average height (Ra) was 0.6 μm. Then, the sheet was immersed in 30% aqueous sulfuric acid and desmutted at 55° C. for 2 minutes. The sheet was effected the anoidically electric treatment to give a thickness of 2.7 g/dm$^2$ under the current density of 2 A/dm$^2$. Thereafter, the sheet was immersed in 2.5% aqueous solution of sodium silicate having a temperature of 70° C. for 1 minute and dried.

Preparation of PS plate

On the aluminum support was coated the coating solution for hydrophilic layer using a whirler, and then the coated layer was dried at 100° C. for 1 minute to form a hydrophilic layer of 50 mg/m$^2$.

To 10.0 g of the light-sensitive microcapsule dispersion were added 1.8 g of 10% aqueous solution (solvent: water/ethanol=1/1 as volume ratio) of guanidine trichroloacetate, 10 g of water and 0.1 g of White Dextrin (produced by Nichiden Kagaku Co., Ltd.) to prepare a coating solution. Thus prepared coating solution was coated on the hydrophilic layer, and the coated layer was dried to give a light-sensitive layer of 3 g/m$^2$. Thus, a PS plate (I) having an aluminum support, a hydrophilic layer and a light-sensitive layer was obtained.

COMPARISON EXAMPLE 1

A PS plate (II) was prepared in the same manner as in Example 1, except that a hydrophilic layer was not formed.

Evaluation of PS plate (1) Each of the PS plates (I) & (II) was imagewise exposed to light using a tungsten lamp at 200 lux for 1 second and then heated on a hot plate at 125° C. for 60 seconds. The PS plate was further heated at 170° C. for 1 minute and subjected to whole image exposure to obtain each of lithographic plates (I-A ) & (II-A).

(2) Each of the PS plates (I) & (II) was imagewise exposed to light using a tungsten lamp at 200 lux for 1 second and then heated on a hot plate at 125° C. for 60 seconds. The PS plate was further heated at 170° C. for 1 min., and subjected to whole image exposure. The exposed area was washed off to obtain each of lithographic plates (I-B) & (II-B).

Each of the lithographic plates (I-A) & (I-B) and (II-A) & (II-B) gave a printed image having a clear image after it was processed with dampening water in a Heidel-berg G.T.O. type printing machine. Further, each of the lithographic plates (I-A) & (I-B) gave an improved image in which scumming was reduced.

EXAMPLE 2

Preparation of light-sensitive microcapsule

In 40 g of trimethylolpropane was the light-sensitive composition was dissolved 5 g of 2,2-dimethoxy-2-phenylacetophenone, and to the mixture was added 15 g of an adduct of xylene diisocyanate and trimethylolpropane (tradename "Takenate D110N" produced by Takeda Chemical Industries, Ltd.) to obtain an oily phase.

The oily phase was conducted to 70 g of 2% aqueous solution of polyvinyl alcohol (tradename "PVA-205" produced by Kuraray Co., Ltd.), and the mixture was emulsified. To the emulsion was added 20 g of 1.67% aqueous solution of diethylenetriamine while stirring, and then was stirred continueuously. After 30 minutes, the emulsion was heated to a temperature of 40° C., and then was stirred and cooled to obtain a dispersion containing light-sensitive microcapsule having an average particle size of 2.1 μm.

Preparation of PS plate

On the aluminum support was coated the coating solution for formation of a hydrophilic layer prepared in Example 1 to give a coated layer using a whirler, and the coated layer was then dried at 100° C. for 1 minute to form a hydrophilic layer of 50 mg/m$^2$.

To 50.0 g of the light-sensitive microcapsule dispersion were added 100 g of water and 0.1 g of White Dextrin (produced by Nichiden Kagaku Co., Ltd.) to prepare a coating solution. The coating solution was coated on the hydrophilic layer to give a coated layer and then the coated layer was dried to obtain a light-sensitive layer of 3 g/m$^2$. Thus, a PS plate (III) having an aluminum support, a hydrophilic layer and a light-sensitive layer was obtained.

COMPARISON EXAMPLE 2

A PS plate (IV) was prepared in the same manner as in Example 2, except that a hydrophilic layer was not formed.

Evaluation of PS plate (3) Each of the PS plates (III) & (IV) was imagewise exposed to light using a carbon arc lamp of 30 A from a distance of 1.40 m. The PS plate was further heated at 170° C. for 1 minute and subjected to whole image exposure to obtain each of lithographic plates (III-A) & (IV-A).

(4) Each of the PS plates (III) & (IV) was imagewise exposed to light using a carbon arc lamp of 30 A from a distance of 1.40 m. The PS plate was further heated at 170° C. for 1 minute and subjected to whole image exposure. The exposed area was washed off to obtain each of lithographic plates (III-B) & (IV-B).

Each of the lithographic plates (III-A) & (III-B) and (IV-A) & (IV-B) gave a printed image having a clear image after it was processed by dampening water in Heidelberg G.T.O type printing machine. Each of the lithographic plates (IV-A) & (IV-B) gave an improved image in which scumming was reduced.

I claim:

1. A process for the preparation of a lithographic plate comprising the steps of:

exposing imagewise to a radiation a presensitized lithographic plate which comprises a hydrophilic layer and a light-sensitive layer containing silver halide, a reducing agent, an ethylenically unsaturated polymerizable compound and a hydrophilic binder provided in order on a hydrophilic support wherein the silver halide, the reducing agent and the polymerizable compound are contained in lipophilic microcapsules which are dispersed in the light-sensitive layer;

heating the exposed light-sensitive layer for development simultaneously with or after the above step, whereby the polymerizable compound within the area where a latent image of the silver halide has been formed is cured by polymerization to form a polymer;

heating the developed layer to a temperature of not higher than a thermal softening point of the resulting polymer but not lower than a thermal softening point of shell material of the microcapsules, whereby the polymerizable compound within the area where a latent image of the silver halide has not been formed runs out of the microcapsules and is cured by polymerization; and removing the microcapsules together with the hydrophilic layer from the area where a latent image of the silver halide was formed.

2. The process for the preparation of a lithographic plate as claimed in claim 1, wherein the step of heating for development is performed at a temperature in the range of 80° to 200° C. for a period of 1 second to 5 minutes.

3. The process for the preparation of a lithographic plate as claimed in claim 1, wherein the step of heating the developed layer is performed at a temperature in the range of 80° to 300° C. for a period of 3 seconds to 20 minutes.

4. The process for the preparation of a lithographic plate as claimed in claim 1, wherein the step of heating the developed layer is performed under the condition that the developed layer is placed under pressure.

5. A process for the preparation of a lithographic plate comprising the steps of:

exposing imagewise to a radiation a presensitized lithographic plate which comprises a hydrophilic layer and a light-sensitive layer containing silver halide, a reducing agent, an ethylenically unsaturated polymerizable compound and a hydrophilic binder provided in order on a hydrophilic support wherein the silver halide, the reducing agent and the polymerizable compound are contained in lipophilic microcapsules which are dispersed in the light-sensitive layer;

heating the exposed light-sensitive layer for development simultaneously with or after the above step, whereby the polymerizable compound within the area where a latent image of the silver halide has been formed is cured by polymerization to form a polymer;

pressing the developed layer to break the microcapsules whereby the polymerizable compound within the area where a latent image of the silver halide has not been formed runs out of the broken microcapsules;

curing the run-out polymerizable compound by polymerization; and removing the microcapsules together with the hydrophilic layer from the area where a latent image of the silver halide was formed.

6. The process for the preparation of a lithographic plate as claimed in claim 5, wherein the step of heating for development is performed at a temperature in the range of 80° to 200° C. for a period of 1 second to 5 ; minutes.

7. The process for the preparation of a lithographic plate as claimed in claim 5, wherein the step of pressing the developed layer is performed at a pressure in the range of 100 to 600 kg/cm$^2$.

8. A process for the preparation of a lithographic plate comprising the steps of:

exposing imagewise to a radiation a presensitized lithographic plate which comprises a hydrophilic layer and a light-sensitive layer containing a photo polymerizable composition or an ethylenically unsaturated photo polymerizable compound and a hydrophilic binder provided in order on a hydrophilic support wherein the photo polymerizable composition or the photo polymerizable compound are contained in lipophilic microcapsules which are dispersed in the light-sensitive layer said photo polymerizable composition comprising a photopolymerization initiator and an ethylenically unsaturated compound;

heating the developed layer to a temperature of not higher than a thermal softening point of the resulting polymer but not lower than a thermal softening point of shell material of the microcapsules, whereby the polymerizable composition or the photo polymerizable compound within the exposed area runs out of the microcapsules and is cured by polymerization; and removing the microcapsules together with the hydrophilic layer from the exposed area.

9. The process for the preparation of a lithographic plate as claimed in claim 8, wherein the step of heating the developed layer is performed at a temperature in the range of 80° to 300° C. for a period of 3 seconds to 20 minutes.

10. The process for the preparation of a lithographic plate as claimed in claim 8, wherein the step of heating the developed layer performed under the condition that the developed layer is placed under pressure.

11. A process for the preparation of a lithographic plate comprising the steps of:

exposing imagewise to a radiation a presensitized lithographic plate which comprises a hydrophilic layer and a light-sensitive layer containing a photo polymerizable composition or an ethylenically unsaturated photo polymerizable compound and a hydrophilic binder provided in order on a hydrophilic support wherein the photo polymerizable composition or the photo polymerizable compound are contained in lipophilic microcapsules which are dispersed in the light-sensitive layer, said photo polymerizable composition comprising a photopolymerization initiator and an ethylenically unsaturated polymerizable compound;

pressing the developed layer to break the microcapsules whereby the photo polymerizable composition or the photo polymerizable compound within the exposed area runs out of the broken microcapsules;

curing the run-out polymerizable composition and/or photo polymerizable compound by polymerization; and removing the microcapsules together with the hydrophilic layer from the exposed area.

12. The process for the preparation of a lithographic plate as claimed in claim 11, wherein the step of pressing the developed layer is performed at a pressure in the range of 100 to 600 kg/cm$^2$.

* * * * *